(12) United States Patent  (10) Patent No.: US 9,166,119 B2
Shimizu et al.  (45) Date of Patent: Oct. 20, 2015

(54) LIGHT-EMITTING DEVICE

(75) Inventors: Haruka Shimizu, Ageo (JP); Masaaki Inamura, Ageo (JP); Asuka Sasakura, Ageo (JP); Akinori Kumagai, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 14/009,650

(22) PCT Filed: Feb. 22, 2012

(86) PCT No.: PCT/JP2012/054226
§ 371 (c)(1),
(2), (4) Date: Oct. 3, 2013

(87) PCT Pub. No.: WO2012/137552
PCT Pub. Date: Oct. 11, 2012

(65) Prior Publication Data
US 2014/0021502 A1  Jan. 23, 2014

(30) Foreign Application Priority Data
Apr. 5, 2011 (JP) ................................ 2011-083834

(51) Int. Cl.
H01L 33/00 (2010.01)
H01L 33/50 (2010.01)
H01L 33/56 (2010.01)

(52) U.S. Cl.
CPC ............ *H01L 33/502* (2013.01); *H01L 33/501* (2013.01); *H01L 33/56* (2013.01); *H01L 2933/005* (2013.01); *H01L 2933/0041* (2013.01)

(58) Field of Classification Search
CPC ........ H01L 33/54; H01L 33/58; H01L 33/483; H01L 33/501; H01L 33/502
USPC ..................................... 257/98–100
See application file for complete search history.

(56) References Cited

U.S. PATENT DOCUMENTS

| 7,202,598 | B2 | 4/2007 | Juestel et al. | |
| 7,820,074 | B2 | 10/2010 | Kim et al. | |
| 8,262,936 | B2 | 9/2012 | Kim et al. | |
| 2002/0153835 | A1* | 10/2002 | Fujiwara et al. | ............ 313/512 |
| 2004/0166320 | A1 | 8/2004 | Kobusch | |
| 2005/0253158 | A1* | 11/2005 | Yasukawa et al. | ............ 257/98 |

(Continued)

FOREIGN PATENT DOCUMENTS

| EP | 2085411 A2 | 8/2009 |
| JP | 2002173675 A | 6/2002 |
| JP | 2002223008 A | 8/2002 |

(Continued)

*Primary Examiner* — Brook Kebede
(74) *Attorney, Agent, or Firm* — The Webb Law Firm

(57) ABSTRACT

A highly reliable light-emitting device is provided, which is capable of effectively suppressing detrimental effects of sulfuric gas. A light-emitting device comprising a solid light-emitting element 1, a metal member 2 reacting with sulfuric gas and a phosphor-containing layer 5 that contains a phosphor 3, the phosphor-containing layer 5 containing a sulfuric gas-adsorbing substance 4 that adsorbs sulfuric gas, and, when the phosphor-containing layer 5 is tripartitioned from the side near the metal member to far into a proximal layer portion, an intermediate layer portion and an outer layer portion, the concentration of sulfuric gas-adsorbing substance 4 in the proximal layer portion is made to be higher than those for the intermediate layer portion and the outer layer portion.

30 Claims, 7 Drawing Sheets

(56) References Cited

U.S. PATENT DOCUMENTS

2008/0241590 A1 10/2008 Kim et al.
2009/0189510 A1 7/2009 Kanamori et al.

FOREIGN PATENT DOCUMENTS

| | | | |
|---|---|---|---|
| JP | 2004099826 A | 4/2004 | |
| JP | 2004250705 A | 9/2004 | |
| JP | 2005082788 A | 3/2005 | |
| JP | 200630708 A | 2/2006 | |
| JP | 2006028458 A | 2/2006 | |
| JP | 2006312663 A | 11/2006 | |
| JP | 2007123390 A | 5/2007 | |
| JP | 2008007779 A | 1/2008 | |
| JP | 2008010591 A | 1/2008 | |
| JP | 2008308510 A | 12/2008 | |
| JP | 2009013186 A | 1/2009 | |
| JP | 2009111245 A | 5/2009 | |
| JP | 2009170824 A | 7/2009 | |
| JP | 2009191189 A | 8/2009 | |
| JP | 2010010279 A | 1/2010 | |
| JP | 2011009707 A | 1/2011 | |
| WO | 2010064325 A1 | 6/2010 | |

\* cited by examiner

FIG. 15
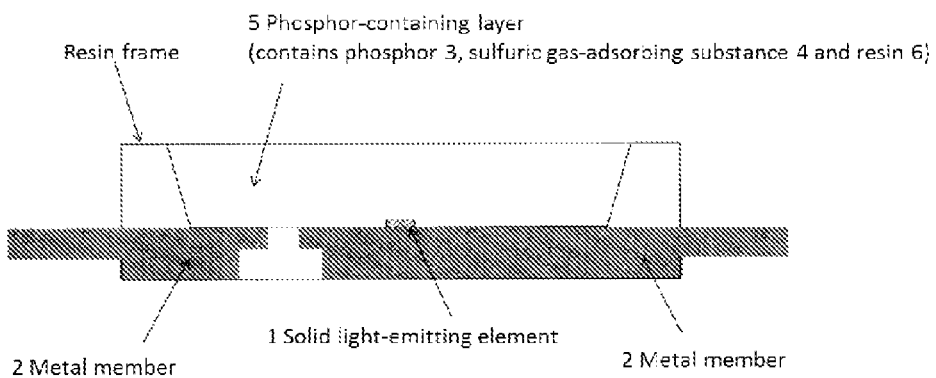
[FIG. 16]
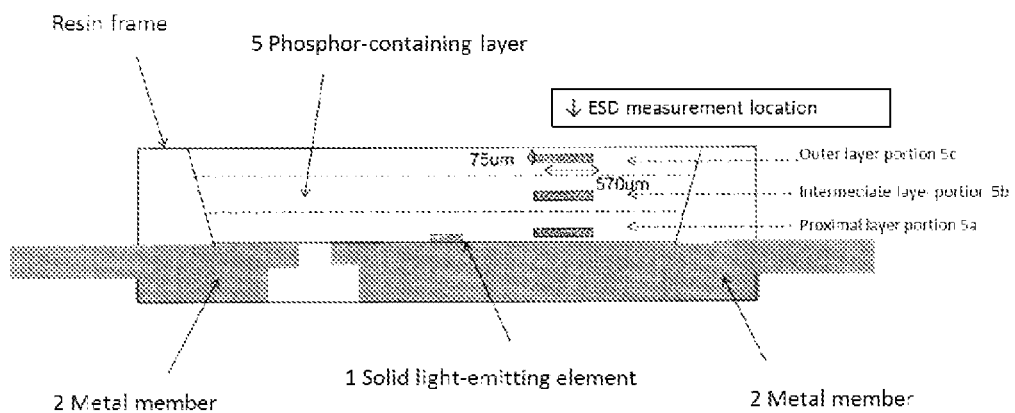
[FIG. 17]
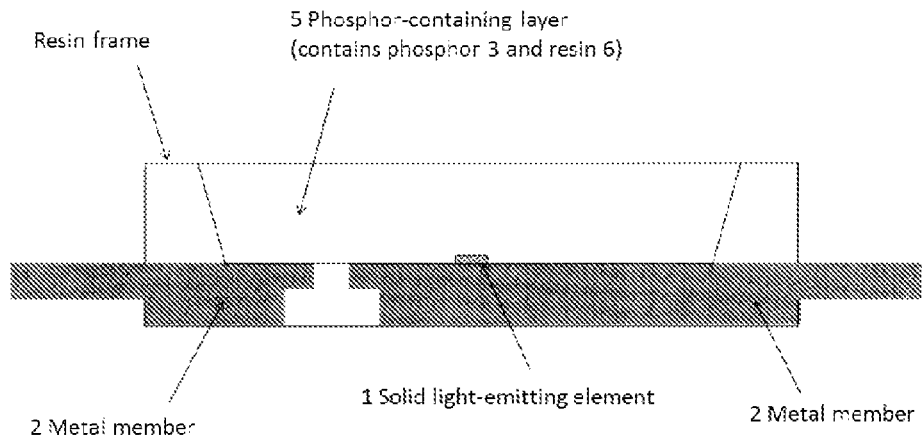

FIG. 18
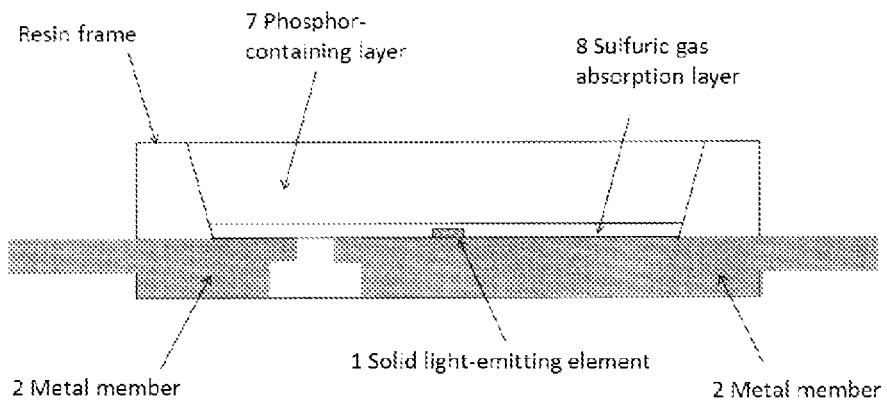
FIG. 19
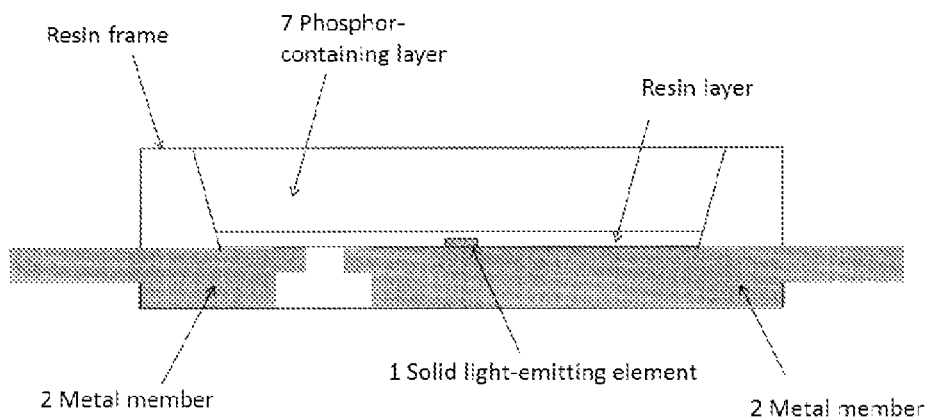
[FIG. 20]
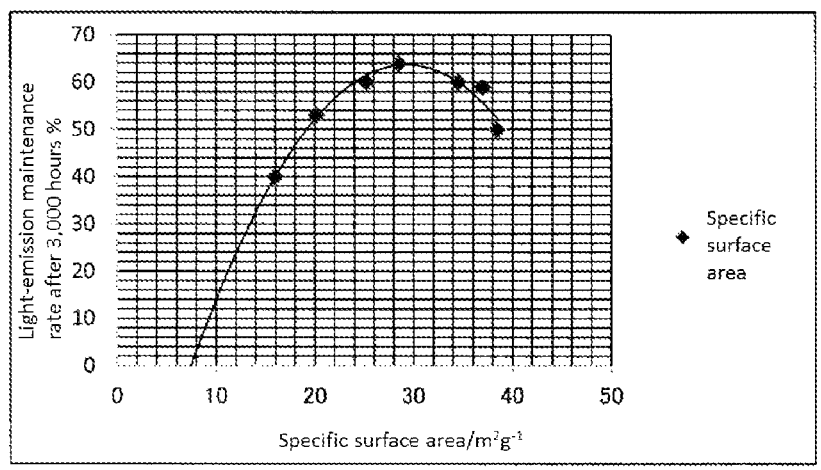

LIGHT-EMITTING DEVICE

CROSS-REFERENCE TO RELATED APPLICATIONS

This application is the United States national phase of International Application No. PCT/JP2012/054226 filed Feb. 22, 2012, and claims priority to Japanese Patent Application No. 2011-083834 filed Apr. 5, 2011, the disclosures of which are hereby incorporated in their entirety by reference.

TECHNICAL FIELD

The present invention relates to a light-emitting device that is capable of suppressing detrimental effects of sulfuric gas effectively.

TECHNICAL BACKGROUND

Although the current mainstream in light sources for lighting are fluorescent tubes and filament bulbs, light-emitting devices with LED as light source are becoming more widely used, since, compared to a fluorescent tube or the like, when an LED is used in a light source, in addition to power consumption being low, life span being long and safety being provided of not being hot to the touch, environmental aspects are excellent with no harmful substance such as mercury being contained.

Known as light-emitting devices using LEDs are light-emitting devices provided with a constitution in which, for instance, LEDs are disposed over a metal plate comprising silver plating performed on copper serving as a reflective plate, and the LEDs and metal plate are sealed with a phosphor-containing resin comprising a phosphor included in a resin such as silicon resin.

When a sulfur-containing phosphor is used in such a light-emitting device, since sulfur-containing phosphors react readily with water, sulfuric gas such as hydrogen sulfide, sulfur dioxide or sulfur trioxide is generated, for instance, by reaction with atmospheric moisture, or the like, and problems have been pointed out, such as, this sulfuric gas corrodes a metal member, for instance, a metal member inside an element that is provided for the purpose of raising the reflectance of the reflective plate, such as an Ag-plating film (hereafter referred to as "Ag reflective film"), decreasing the reflection performance thereof, or provoking an electrical defect such as wiring disconnection.

In addition, since sulfuric gas is present in the atmosphere at hot spring resorts or the like, even when a phosphor other than a sulfur-containing phosphor is used, the possibility has been pointed out, that, due to atmospheric sulfuric gas, a metal member inside an element, such as an Ag reflective film, becomes corroded, decreasing the reflection performance, or provoking an electrical defect such as wiring disconnection.

Upon examining the techniques proposed in prior art for solving such problems regarding light-emitting devices, for instance, with the purpose of improving moisture-resistance or the like, methods of covering this species of phosphor with a glass material or the like (Patent Document 1, Patent Document 2, Patent Document 3, Patent Document 4 and Patent Document 5), the method of covering the surface of phosphor particles by a chemical vapor phase reaction method (Patent Document 6), the method of binding particles of a metal compound (Patent Document 7), and the like, have been proposed.

PRIOR ART REFERENCES

Patent Documents

[Patent document 1] Japanese Patent Application Laid-open No. 2002-223008
[Patent document 2] Japanese Patent Application Laid-open No. 2004-250705
[Patent document 3] Japanese Patent Application Laid-open No. 2002-173675
[Patent document 4] Japanese Patent Application Laid-open No. 2008-7779
[Patent document 5] Japanese Patent Application Laid-open No. 2009-13186
[Patent document 6] Japanese Patent Application Laid-open No. 2005-82788
[Patent document 7] Japanese Patent Application Laid-open No. 2006-28458

SUMMARY OF THE INVENTION

The present invention proposes a novel light-emitting device capable of suppressing detrimental effects of sulfuric gas effectively.

The present invention proposes a light-emitting device comprising a solid light-emitting element, a metal member reacting with sulfuric gas and a phosphor-containing layer, the phosphor-containing layer containing a sulfuric gas-adsorbing substance that adsorbs sulfuric gas, and, when the phosphor-containing layer is tripartitioned from the side near the metal member to far into a proximal layer portion, an intermediate layer portion and an outer layer portion, the concentration of sulfuric gas-adsorbing substance in the proximal layer portion is higher than those for the intermediate layer portion and the outer layer portion.

The present invention proposes in addition a light-emitting device comprising a solid light-emitting element, a metal member reacting with sulfuric gas and a phosphor-containing layer, further provided with a sulfuric gas absorption layer containing a sulfuric gas-adsorbing substance that adsorbs sulfuric gas between the metal member and the phosphor-containing layer.

By including a sulfuric gas-adsorbing substance in the phosphor-containing layer covering the metal member and by including even more sulfuric gas-adsorbing substance on the side of the phosphor-containing layer near the metal member, corrosion of the metal member by the sulfuric gas can be suppressed even in a case where a sulfur-containing phosphor is used, since the sulfuric gas-adsorbing substance adsorbs the generated sulfuric gas caused by the sulfur-containing phosphor. In addition, corrosion by the sulfuric gas present in the atmosphere can also be suppressed.

By providing a sulfuric gas absorption layer containing a sulfuric gas-adsorbing substance between the metal member and the phosphor-containing layer, corrosion by sulfuric gas can be suppressed similarly.

BRIEF DESCRIPTION OF THE DRAWINGS

FIG. 15 Longitudinal cross-sectional view of an LED package produced in (Example 1-1) to (Example 1-7).

FIG. 16 Longitudinal cross-sectional view, which is a figure for explaining the measurement method when the element concentration of each layer is measured by dividing into three zones for an LED package produced in (Example 1-3), in particular showing EDS measurement sites.

FIG. 17 Longitudinal cross-sectional view of LED package produced in (Comparative Example 1-1).

FIG. 18 Longitudinal cross-sectional view of LED packages produced in (Example 2-1) to (Example 2-18).

FIG. 19 Longitudinal cross-sectional view of LED package produced in (Comparative Example 2-1).

FIG. 20 Graph showing the relationship between the specific surface area of ZnO and the light-emission intensity maintenance rate for Examples 3-1 to 3-10.

DESCRIPTION OF THE INVENTION

Figure 1:
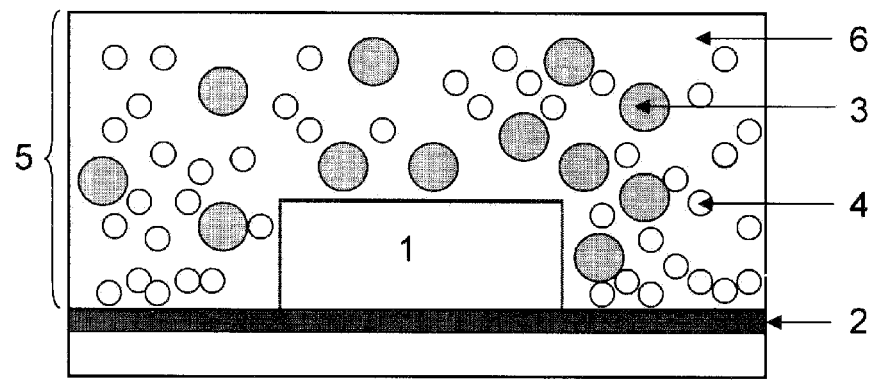
FIG. 1 Cross-sectional view showing an example of a first embodiment of the present invention.

Next, the present invention will be described based on exemplary embodiments; however, the present invention is not limited to the embodiments described next.

<Light-emitting Device A>

The light-emitting device A according to a first embodiment (hereafter referred to as "the present light-emitting device A") is a light-emitting device comprising a solid light-emitting element 1, a metal member 2 reacting with sulfuric gas, and a phosphor-containing layer 5 containing a phosphor 3, a sulfuric gas-adsorbing substance 4 and a resin 6.

Figure 2:
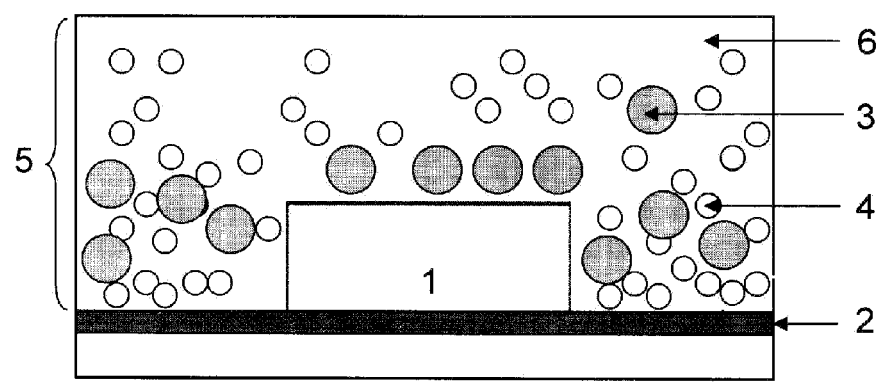
FIG. 2 Cross-sectional view showing a variation example of the first embodiment of the present invention.

Here, the light-emitting devices shown in FIG. 1 and FIG. 2 are ones indicating an example of the present light-emitting device A. That is to say, it is a light-emitting device provided with a constitution formed so as to dispose a solid light-emitting element 1 on a metal member 2 serving as a reflective plate while covering the metal member 2 with a phosphor-containing layer 5 containing a phosphor 3, a sulfuric gas-adsorbing substance 4 and a resin 6.

However, as described below, the constitution of the present light-emitting device A is not limited to such a light-emitting device.

It is important for the phosphor-containing layer 5 of the present light-emitting device A that the concentration in sulfuric gas-adsorbing substance 4 is higher for the side nearer to the metal member 2. For instance as shown in FIG. 1 and FIG. 2, when tripartitioning the layer so as to have three equal thicknesses oriented from the side near the metal member 2 to far into three zones of a proximal layer portion 5a, an intermediate layer portion 5b and an outer layer portion 5c, it suffices that the concentration in sulfuric gas-adsorbing substance 4 of the proximal layer portion 5a is higher than those of the intermediate layer portion 5b and the outer layer portion 5c. In so doing, "when tripartitioning" does not mean actually separating into three layers, but means when tripartitioning equally as a concept according to the distance from the metal member 2.

It suffices for the phosphor 3 to be dispersed inside the phosphor-containing layer 5. That is to say, within the phosphor-containing layer 5, the phosphor 3 may be dispersed homogeneously or heterogeneously, or may be dispersed with a concentration distribution in the depth direction. In addition, it may be sedimented and dispersed in the form of layers. For instance, the phosphor 3 may be dispersed homogeneously within the phosphor-containing layer 5, as shown in FIG. 1, or may be dispersed with a concentration distribution as shown in FIG. 2.

In order to form the phosphor-containing layer 5 in this manner, for instance, when preparing a phosphor-containing resin composition that contains the phosphor 3, the sulfuric gas-adsorbing substance 4 and the resin 6, it suffices to prepare two or more phosphor-containing resin compositions with different concentrations of sulfuric gas-adsorbing substance 4 and layer them sequentially in such a way that the nearer the side to the metal member 2, the higher the concentration in the sulfuric gas-adsorbing substance 4.

In addition, if the sulfuric gas-adsorbing substance 4 can sediment inside the resin 6 prior to curing, by preparing a phosphor-containing resin composition that contains the phosphor 3, the sulfuric gas-adsorbing substance 4 and the resin 6, filling this resin composition over the metal member 2, and taking the time for curing, the sulfuric gas-adsorbing substance 4 can be sedimented so that the concentration of the sulfuric gas-adsorbing substance 4 is higher the nearer the side to the metal member 2.

However, there is no limitation to these methods.

<Light-emitting Device B>

The light-emitting device B according to a second embodiment of the present invention (hereafter referred to as "the present light-emitting device B") is a light-emitting device provided with a solid light-emitting element 1, a metal member 2 reacting with sulfuric gas, a phosphor-containing layer 7 that contains a phosphor 3, and a sulfuric gas absorption layer 8 that contains a sulfuric gas-adsorbing substance 4.

Here, the light-emitting devices shown in FIG. 3 to FIG. 10 are ones indicating an example of the present light-emitting device B.

That is to say, it is a light-emitting device provided with a constitution comprising, on a metal member 2 serving as a reflective plate, a sulfuric gas absorption layer 8, which comprises a sulfuric gas-adsorbing substance 4 and a resin 6, covering a solid light-emitting element 1 and the metal member 2, and a phosphor-containing layer 7, which contains a phosphor 3 and a resin 6, covering the outer side thereof.

However, as described below, the constitution of the present light-emitting device B is not limited to such a light-emitting device.

It suffices for the sulfuric gas absorption layer 8 to be formed closer to the metal member 2 than the phosphor-containing layer 7, and forming may be such that the metal member 2 is covered, or, as shown in FIG. 7 to FIG. 10, forming may be such that the solid light-emitting element 1 is covered, or, as shown in FIG. 3 to FIG. 6, forming may be such that a portion of the solid light-emitting element 1 is covered.

Figure 11:
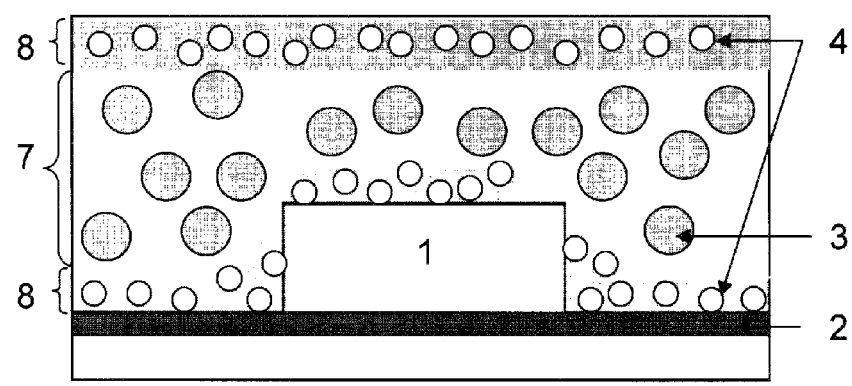
FIG. 11 Cross-sectional view showing an example of a different embodiment of the present invention.
Figure 12:
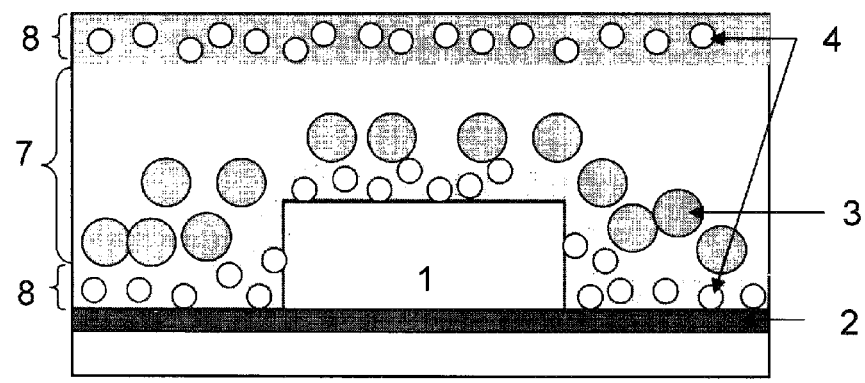
FIG. 12 Cross-sectional view showing a variation example of the embodiment of FIG. 11.

In addition to near the metal member 2, the sulfuric gas absorption layer 8 may be layered away from the metal member 2, for instance as shown in FIG. 11 and FIG. 12.

In addition, as shown in FIG. 11 and FIG. 12, the constitution may be such that the sulfuric gas absorption layer 8 is also provided at the side-most layer to sandwich the phosphor-containing layer 7 from both sides with the sulfuric gas absorption layer 8.

Figure 3:
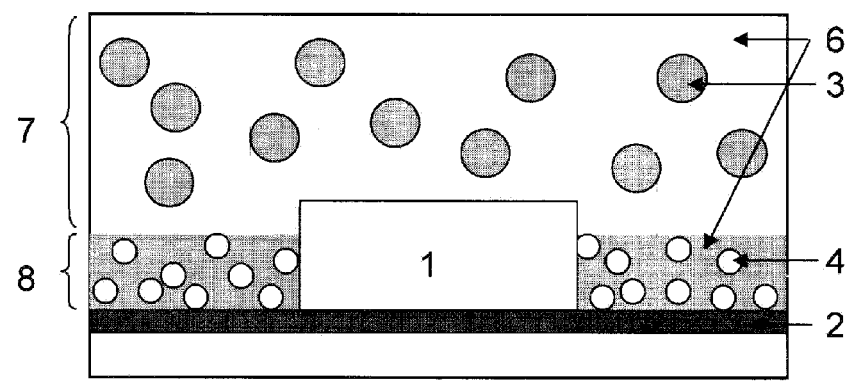
FIG. 3 Cross-sectional view showing an example of a second embodiment of the present invention.
Figure 4:
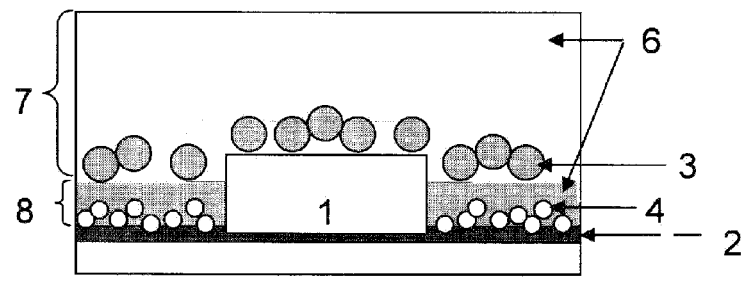
FIG. 4 Cross-sectional view showing a variation example of the second embodiment of the present invention.
Figure 5:
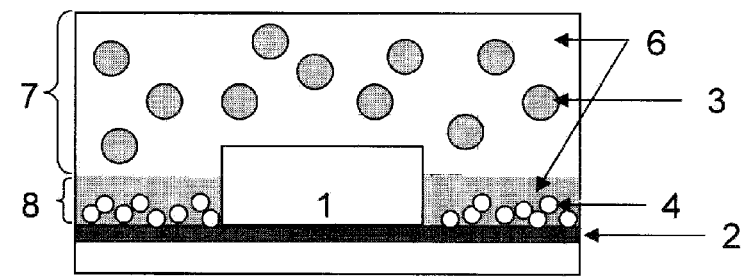
FIG. 5 Cross-sectional view showing a variation example of the second embodiment of the present invention.
Figure 6:
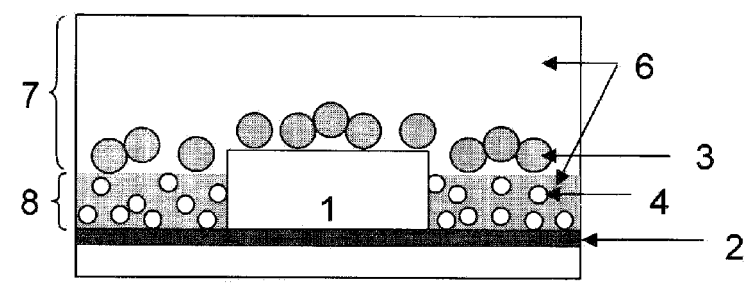
FIG. 6 Cross-sectional view showing a variation example of the second embodiment of the present invention.
Figure 7:
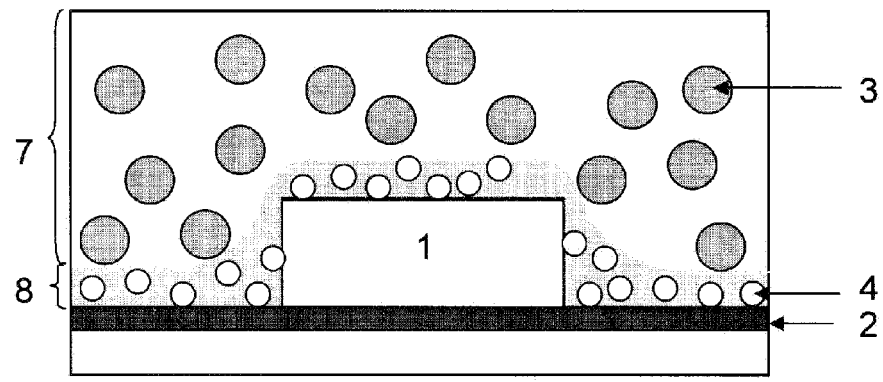
FIG. 7 Cross-sectional view showing a variation example of the second embodiment of the present invention.
Figure 8:
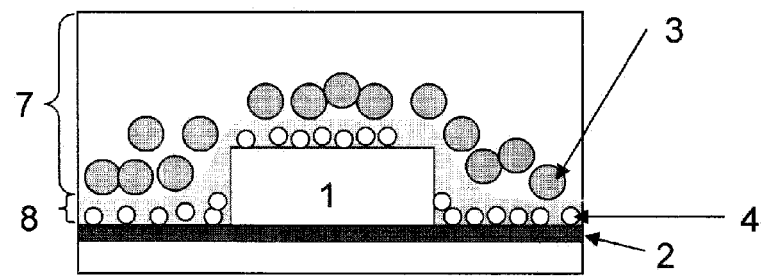
FIG. 8 Cross-sectional view showing a variation example of the second embodiment of the present invention.
Figure 9:
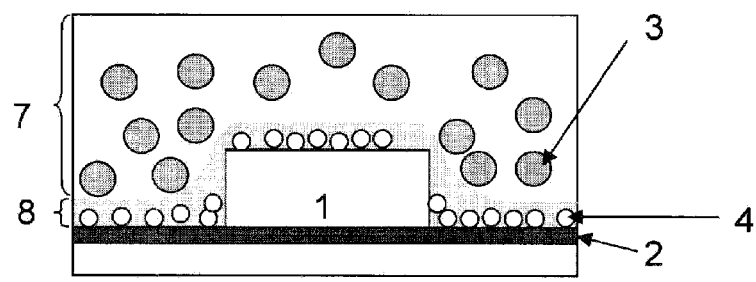
FIG. 9 Cross-sectional view showing a variation example of the second embodiment of the present invention.
Figure 10:
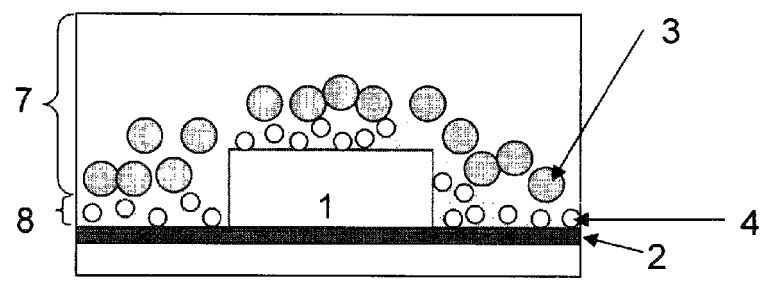
FIG. 10 Cross-sectional view showing a variation example of the second embodiment of the present invention.

It suffices for the phosphor 3 in the phosphor-containing layer 7 to be dispersed in each layer respectively. That is to say, it may be either dispersed homogeneously or dispersed heterogeneously respectively in each layer, or, dispersed with a concentration distribution in the depth direction, or sedimented and dispersed in the form of layers. For instance, as shown in FIG. 3, the phosphor 3 in the phosphor-containing layer 7, as shown in FIG. 3 and FIG. 5, may be dispersed homogeneously within the phosphor-containing layer 7, or, as shown in FIG. 4 and FIG. 6 may be sedimented and dispersed in the form of layers.

Regarding the proportion of sulfuric gas-adsorbing substance 4 contained in the sulfuric gas absorption layer 8, if the amount of sulfuric gas-adsorbing substance 4 is too small, sufficient sulfuric gas adsorption effect cannot be obtained, on the other hand, if too large, light extraction deteriorates, thus, for the proportion of sulfuric gas-adsorbing substance 4 contained in the sulfuric gas absorption layer 8 with respect to the resin 6, 0.01 to 40 parts in mass is desirable, of which 0.1 parts in mass or higher or 20 parts in mass or lower is desirable.

It suffices for the sulfuric gas-adsorbing substance 4 in the sulfuric gas absorption layer 8 to be either dispersed homogeneously or dispersed heterogeneously respectively in each layer, or, dispersed with a concentration distribution in the depth direction, or sedimented and dispersed in the form of layers. For instance, as shown in FIG. 3 and FIG. 6, the substance may be distributed homogeneously within the sulfuric gas absorption layer 8; in addition, as shown in FIG. 4 and FIG. 5, the substance may be sedimented and dispersed in the form of layers within the sulfuric gas-adsorbing substance 4.

<Solid Light-emitting Element 1>

As solid light-emitting element 1 used in the present light-emitting devices A and B, for instance, LED, laser, electro luminescence, and the like, can be cited.

<Metal Member 2>

If the metal member 2 used in the present light-emitting devices A and B is a metal member that reacts with sulfuric gas, then, an effect is exerted. That is to say, it suffices to be one comprising a metal or an alloy that contains one or more species of group VIII series metal or group IB series metal. Concretely, for instance, silver, silver series alloy, copper, copper series alloy, nickel, nickel series alloy, iron, iron series alloy, and the like, can be cited.

In addition, while the morphology of the metal member 2 presents a plate form in the examples of FIG. 1-10, there is no particular limitation.

<Phosphor 3>

It suffices for the phosphor 3 used in the present light-emitting device A and B to be a substance that emits a visible light by irradiation of light, and while it can benefit from the effects of the present invention all the more if it is a sulfur-containing phosphor that contains sulfur, it may also be a phosphor that does not contain sulfur. The reason is that, even with a phosphor that does not contain sulfur, a light-emitting device deteriorates due to sulfuric gases contained in the atmosphere.

For the phosphor, a composition comprising an activator element or a co-activator element combined with a host material is common. In so doing, as the host material, for instance, metal oxides typified by $Y_2O_3$ or the like, metal nitrides typified by $Sr_2Si_5N_8$, $(Sr,Ca)AlSiN_3$ or the like, oxynitrides typified by sialon, phosphates typified by $Ca_5(PO_4)_3Cl$ or the like, sulfides typified by ZnS, SrS, CaS or the like, can be cited. More concretely, for instance, sulfides such as $(Zn,Cd)S$, $SrGa_2S_4$, $CaGa_2S_4$, SrS, CaS and ZnS, oxysulfides such as $Y_2O_2S$, silicates such as $BaAl_2Si_2O_8$, $Y_2SiO_5$, $Zn_2SiO_4$, and $Sr_2SiO_4$, oxides such as $SnO_2$, $Y_2O_3$, $(Y,Gd)_3Al_5O_{12}$, $YAlO_3$, $BaMgAl_{10}O_{17}$, $(Ba,Sr)(Mg,Mn)Al_{10}O_{17}$, $(Ba,Sr,Ca)(Mg,Zn,Mn)Al_{10}O_{17}$, $BaAl_{12}O_{19}$, $CaMgAl_{10}O_{17}$ and $(Ba,Sr,Mg)O.Al_2O_3$, borates such as $GdMgB_5O_{10}$ and $(Y,Gd)BO_3$, halophosphates such as $Ca_{10}(PO_4)_6(F,Cl)_2$ and $(Sr,Ca,Ba,Mg)_{10}(PO_4)_6Cl_2$, phosphates such as $Sr_2P_2O_7$ and $(La,Ce)PO_4$, and the like, can be cited.

In addition, as activator elements or co-activator elements, ions of rare-earth metals such as Ce, Pr, Nd, Pm, Sm, Eu, Tb, Dy, Ho, Er, Tm and Yb, and ions of metals such as Ag, Cu, Au, Al, Mn and Sb can be cited.

As for the sulfur-containing phosphor, there is no particular limitation to the concrete composition if it contains sulfur. If it contains sulfur (S) in the host material, any composition has the possibility of reacting with moisture or the like in the air and generating a sulfuric gas such as hydrogen sulfide gas.

As concrete examples, for instance, (Ca, Sr, Ba)S, $(Zn,Cd)(S,Se)$, $Ba_2ZnS_3$, $(Ca,Sr,Ba)(Al,Ga,In)_2S_4:Eu$, $(Ca,Sr,Ba)Ga_2S_4$, $(Ca,Sr,Ba)Al_2S_4$, $(Ca,Sr,Ba)_2SiS_4$, and the like, can be cited. However, there is no limitation to these.

Meanwhile, as activator element or co-activator element luminescent centers (light-emitting ions) to be combined with such host materials, for instance, ions of rare-earth metals such as Sc, Ce, Pr, Nd, Pm, Sm, Eu, Tb, Dy, Ho, Er, Tm and Yb, and ions of transition metals such as Cr, Ti, Ag, Cu, Au, Al, Mn and Sb can be cited. However, there is no limitation to these.

<Sulfuric Gas-adsorbing Substance 4>

As long as it is a substance that is capable of adsorbing sulfuric gas, the sulfuric gas-adsorbing substance 4 used in the present light-emitting devices A and B may be a substance capable of adsorbing physically or may be a substance capable of adsorbing chemically. However, in any case, those for which the sulfuric gas-adsorbing substance maintains transparency after adsorbing sulfuric gas are desirable.

In so doing, "maintains transparent" means that the value of $L^*$ in the $L^*a^*b^*$ color system/color value is 60 or greater as obtained by measuring the body color of the sulfuric gas-adsorbing substance after reaction with sulfuric gas, with a spectrophotometer ("CM-2600d", manufactured by Konica Minolta) at ø3 mm measurement diameter, 10° visual field, D65 observation light source, in the SCI (include specular reflection) mode.

As sulfuric gas-adsorbing substances that are capable of adsorbing sulfuric gas chemically, for instance, in addition to ZnO-based compounds that contain Zn and O, compounds that contain any among Ca, Ba, Sr and Mg, and O, that is to say, alkaline-earth oxides such as MgO-based compounds, CaO-based compounds, BaO-based compounds, SrO-based compounds and rare earth oxides such as $La_2O_3$-based compounds can be cited, of which one species or two or more species can be used.

If the substance is a ZnO-based compound that contains Zn and O, it has the property of reacting with sulfuric gas and not absorbing and not affecting the color of light from an LED or the like, in other words, of being white transparent.

Here, "ZnO-based compound" is a compound that contains Zn and O and there is no limitation to the concrete composition. For instance, crystalline micro-particles of one species, or two or more species chosen from the group comprising ZnO, $Zn(OH)_2$, $ZnSO_4 \cdot nH_2O$ ($0 \leq n \leq 7$), $ZnAl_2O_4$ and $ZnGa_2O_4$ can be cited, and other compositions are adequate. In addition, as in the cases of varistors and photo-catalysts, oxide semiconductor materials and the like, compounds in which ZnO serves as the main component phase or substrate and a dissimilar element has been added thereto, that is to say, compounds represented by ZnO—MOx (M=dissimilar metal such as Al) are also included. For instance, $ZnAl_2O_4$ used in the examples is a ZnO-based compound in which ZnO is the main component phase and $ZnAl_2O_4$ is contained as an impurity phase.

Similarly to ZnO-based compounds, alkaline-earth oxides such as MgO-based compounds, CaO-based compounds, BaO-based compounds and SrO-based compounds and rare earth oxides such as $La_2O_3$-based compounds, and the like, also react with sulfuric gas, and can be considered as not absorbing light from an LED or the like and not affecting the color.

Further in addition, the substance may be an organic acid zinc salt such as zinc stearate.

Regarding ZnO-based compounds used as sulfuric gas-adsorbing substances, from the point of view of allowing the light-emission intensity to be maintained all the more, using ZnO-based compound with a specific surface area of $18 \text{ m}^2/\text{g}$ or greater, of which $18 \text{ m}^2/\text{g}$ or greater, or $40 \text{ m}^2/\text{g}$ or less, is desirable.

As sulfuric gas-adsorbing substances that are capable of adsorbing sulfuric gas physically, for instance, zeolites or molecular sieves, or both of these, can be cited.

<Resin 6>

As resin 6 used in the present light-emitting devices A and B, any among transparent or white thermoplastics, transparent or white thermosetting resins, and, transparent or white photo-curing resins, can be used.

As transparent thermosetting resins, for instance, silicon resins, epoxy resins, acrylic resins, imide resins, and the like, can be indicated as examples.

As transparent thermoplastic resins, for instance, polyethylene resins such as low-density polyethylene, high-density polyethylene and linear low-density polyethylene, or, styrene series resins such as polystyrene resin, ABS resin, AS resin, AAS resin, AES resin and MBS resin, or, acryl series resins such as ethylene-alkyl acrylate or methacrylate copolymer, ethylene-acrylic acid copolymer, ionomer resin, polymethyl methacrylate and polymethacrylate, or, cellulose series resins such as cellulose acetate and cellulose propionate, or, biodegradable plastics such as polylactic acid, other aliphatic polyesters, and modified starch, or, thermoplastic elastomers such as of the styrene series, the nylon series and the olefin series, or, polyamide resins such as various nylons, or, polyester series resins such as polypropylene resin, ethylene-vinyl acetate copolymer, polyvinyl chloride resin, thermoplastic polyurethane resin, thermoplastic polyester resin, polycarbonate resin, polyethylene terephthalate resin, polybutylene terephthalate resin and polyethylene naphthalate resin, and engineering plastics and super engineering plastics such as polyacetal resin, modified polyphenylene ether resin, polymethyl pentene resin, polysulfone resin, polyether sulfone resin, polyallyl sulfone resin, polyarylate resin, polyether imide resin, polyphenylene sulfide resin, polyether ether ketone resin, polyimide resin, polyamide imide resin, fluorine resin and liquid crystal polymer, and the like, can be cited, of which one species can be used alone, or, a polymer blend comprising two or more species can be used.

As photo-curing resins, for instance, urethane resin, acrylic resin, imide resin, silicon resin and the like, can be indicated as examples.

Alternatively to the resin 6, glass, binders or ceramics can also be used.

For instance, if it is the phosphor-containing layer 5 in the present light-emitting device A, the phosphor-containing layer 5 can be formed by molding the phosphor 3 and the sulfuric gas-adsorbing agent 4 together with glass or a binder, in addition, the phosphor-containing layer 5 can be formed by ceramics-casting the phosphor 3 and the sulfuric gas-adsorbing agent 4.

If it is the phosphor-containing layer 7 in the light-emitting device B, the phosphor-containing layer 7 can be formed by molding the phosphor 3 together with glass or a binder, in addition, the phosphor-containing layer 7 can also be formed by ceramics-casting the phosphor 3.

In addition, if it is the sulfuric gas absorption layer 8 in the light-emitting device B, the sulfuric gas absorption layer 8 can be formed by molding the sulfuric gas-adsorbing agent 4 together with glass or a binder, in addition, the sulfuric gas absorption layer 8 can also be formed by ceramics-casting the sulfuric gas-adsorbing agent 4.

<Applications of the Light-emitting Device>

The present light-emitting devices A and B can be used suitably as a part for illumination devices such as LED light bulb devices and LED illumination devices, and for optical devices such as backlight for liquid crystal televisions, traffic lights and indicators.

<Explanation of Terms>

In the present specification, when expressed as "X to Y" (X and Y are any numbers), unless explicitly stated otherwise, the meaning of "X or greater but Y or lower" along with the meaning of "preferably greater than X" or "preferably smaller than Y" are included.

In addition, when expressed as "X or greater" (X is any number) or "Y or lower" (Y is any number), the intent to the effect of "greater than X is desirable" or "less than Y is desirable" is included.

EXAMPLES

Hereafter, the present invention will be described in further detail based on the examples and comparative example described below.

Regarding the samples obtained in the examples and the comparative example, the characteristics were evaluated by the methods described below.

<Evaluation Method>

Samples (LED packages) obtained in the examples and the comparative examples were placed inside a mini environmental tester ("SH-641", manufactured by Espec) set to 85° C. temperature and 85% RH humidity for 200 hours, 1,000 hours or 3,000 hours, and the light-emission intensities before and after the placement were compared.

For the light-emission intensity, 3V voltage and 40 mA current were applied to the sample (LED package), light was collected with an integrating sphere ("FIOS-1", manufactured by Ocean Optics), photometry was performed by being connected to a fiber multi-channel spectrometer ("USB4000", manufactured by Ocean Optics) with an optical fiber ("VIS-NIR", manufactured by Ocean Optics; 50 μm core diameter), the emission spectrum of the LED package was obtained using a measurement software ("OPwave Version1.40", manufactured by Ocean Photonics), with 300 ms integration time, 10 times average iteration and 10 times smoothing iteration and integrated in the range of 400 to 800 nm to determine the light-emission intensity (integration intensity).

The emission spectra and the intensities were corrected using an absolute intensity correction halogen light source ("LS-1-CAL", manufactured by Ocean Optics.

The measurements of the concentration distribution of the sulfuric gas-adsorbing agent and the concentration of the phosphor were carried out by sectioning the sample (LED package) near the center and this cross section was measured for the element concentration using energy dispersive X-ray spectroscopy (EDS). In this measurement, the concentrations of Si, S, Zn and Sr were analyzed using an EDS detector ("INCA Energy 250", manufactured by Oxford Instruments) connected to a field-emission scanning electron microscope (FE-SEM "JSM7001F", manufactured by JEOL) and a quantitative analysis software ("INCA Microanalysis Suite", manufactured by Oxford Instruments).

The acceleration voltage of the field emission scanning electron microscope (FE-SEM) was 5 kV, the current 18 µA and the working distance 10.00 mm, and the quantitative analysis was carried out by point & ID. The setting values for the quantitative analysis were 60 seconds lifetime, process time of 3, and 0 to 20 keV spectral range.

The peak detection positions were 1.74 keV for Si, 2.31 keV for S, 1.02 keV for Zn and 1.58 keV for Sr, and ZAF correction was used to set the total of the four elements at 100 wt. % and measure the mass concentration of each element.

Measurement of the specific surface area was carried out by physically adsorbing nitrogen gas onto a sample placed in a glass cell and determining the adsorbed amount from the weight difference between before and after the adsorption. In this measurement, a multipoint high-speed surface area and pore-size distribution analyzer ("SA3100" manufactured by BECKMAN COULTER) and software ("version 2.13", manufactured by BECKMAN COULTER) were used.

The measurement was performed by the multipoint method by adding 100% nitrogen gas from a vacuum state and varying the partial pressure to 0.05 to 0.20.

Example 1-1

Figure 13:
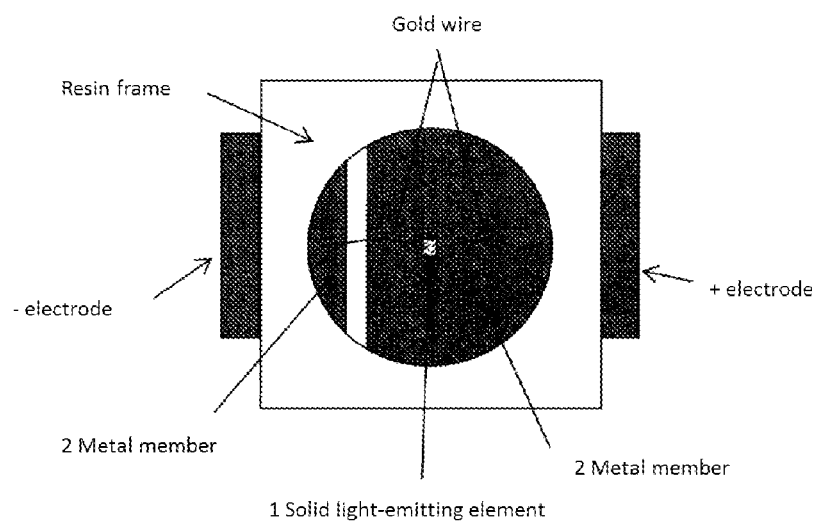
FIG. 13 Top view of an LED package produced in the examples (prior to phosphor filling).
Figure 14:
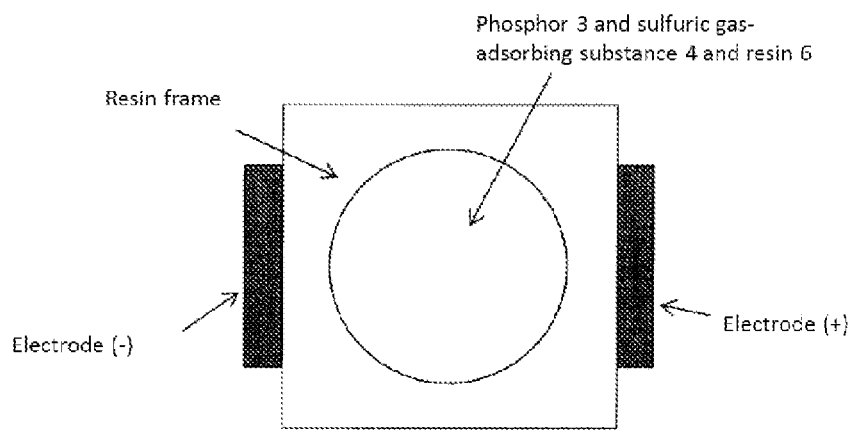
FIG. 14 Partial enlarged top view of the LED package shown in FIG. 13 (after phosphor filling).

In a resin (silicon resin, "OE-6630", manufactured by Toray Dow Corning (Solution A:Solution B=1:4)), phosphor (composition: $SrGa_2S_4$:Eu) of 5 wt. % with respect to the resin and zinc oxide (38.47 $m^2$/g specific surface area) of 2.5 wt. % with respect to the resin were mixed. It was then stirred with a rotation/revolution mixer ("AR-250", manufactured by Thinky), and degassed for 60 seconds each, to obtain a mixture of resin, phosphor and zinc oxide. This mixture was filled into an LED lead frame (refer to FIG. 13) to a thickness of 800 µm. Thereafter, in order to sediment zinc oxide, the mixture was placed sequentially in an oven at 80° C. for 10 minutes, in an oven at 120° C. for 10 minutes and in an oven at 150° C. for 60 minutes, respectively, to cure the silicon resin slowly and produce an LED package (sample) (refer to FIG. 14 and FIG. 15)

Example 1-2

An LED package (sample) was produced similarly to (Example 1-1) except that the concentration in zinc oxide was 5 wt. % with respect to the resin.

Example 1-3

An LED package (sample) was produced similarly to (Example 1-1) except that the concentration in zinc oxide was 10 wt. % with respect to the resin.

The concentration distribution of zinc oxide and phosphor was analyzed for the LED package obtained in (Example 1-3). That is to say, dividing according to the distance from the reflective plate (silver-plated copper alloy), which is positioned in the backward direction from the light extraction side of the LED, into three segments of, from proximity, a proximal layer portion 5a, an intermediate layer portion 5b and an outer layer portion 5c (refer to FIG. 16), analyzing by EDS within a size of 570 µm horizontally and 75 µm vertically in each layer the four elements of Si (derived from silicon resin), S (derived from phosphor), Zn (derived from zinc oxide) and Sr (derived from phosphor) in each layer, and normalizing by the total of the concentration of the four elements, gave the results shown in Table 1.

TABLE 1

| | Si (wt. %) | S (wt. %) | Zn (wt. %) | Sr (wt. %) | Total (wt. %) | Zn/Si | Sr/Si |
|---|---|---|---|---|---|---|---|
| Proximal layer portion | 57.3 | 5.7 | 16.8 | 20.1 | 100 | 0.29 | 0.35 |
| Intermediate layer portion | 57.5 | 5.6 | 16.1 | 20.9 | 100 | 0.28 | 0.36 |
| Outer layer portion | 57.1 | 5.5 | 15.3 | 22.1 | 100 | 0.27 | 0.39 |

As a result, in regard to the LED package obtained in (Example 1-3), when the ratio of the concentration of Zn with respect to the concentration of Si was calculated, it was 0.27 in the outer layer portion 5c in contrast to 0.29 for the proximal layer portion 5a; thus, zinc oxide was found to be sunken.

Meanwhile, when the ratio of the concentration of Sr with respect to the concentration of Si was calculated, it was 0.39 in the outer layer portion 5c in contrast to 0.35 for the proximal layer portion 5a; thus, the phosphor was found not to be sunken.

From the above, zinc oxide was found to be present at high concentrations in the lower layer close to the reflection member which is a metal member.

Example 1-4

An LED package (sample) was produced similarly to (Example 1-1) except that the concentration in zinc oxide was 15 wt. % with respect to the resin.

Example 1-5

An LED package (sample) was produced similarly to (Example 1-1) except that the concentration in zinc oxide was 20 wt. % with respect to the resin.

Example 1-6

An LED package (sample) was produced similarly to (Example 1-1) except that the concentration in zinc oxide was 40 wt. % with respect to the resin.

Example 1-7

An LED package (sample) was produced similarly to (Example 1-1) except that the concentration in zinc oxide was 0.1 wt. % with respect to the resin.

Comparative Example 1-1

An LED package (sample) was produced similarly to (Example 1-1) except that the concentration in zinc oxide was 0 wt. % with respect to the resin, that is to say, zinc oxide was not mixed (see FIG. 17).

Comparative Example 1-2

An attempt was made to produce an LED package (sample) similarly to (Example 1-1) except that the concentration in zinc oxide was 60 wt. % with respect to the resin, however, due to high viscosity, the mixture could not be filled into the LED lead frame, and no LED package (sample) could be produced.

TABLE 2

| | Phosphor concentration (wt. %) | Zinc oxide concentration (wt. %) | Light-emission maintenance rate after 1,000 hours (%) |
|---|---|---|---|
| Example 1-1 | 5 | 2.5 | 70 |
| Example 1-2 | 5 | 5 | 82 |
| Example 1-3 | 5 | 10 | 92 |
| Example 1-4 | 5 | 15 | 98 |
| Example 1-5 | 5 | 20 | 89 |
| Example 1-6 | 5 | 40 | 87 |
| Example 1-7 | 5 | 0.1 | 50 |
| Comparative Example 1-1 | 5 | 0 | 48 |
| Comparative Example 1-2 | 5 | 60 | Could not be produced due to high viscosity |

Example 2-1

In a resin (silicon resin, "OE-6630", manufactured by Toray•Dow Corning (Solution A:Solution B=1:4)), zinc oxide (38.47 m$^2$/g specific surface area) of 0.1 wt. % with respect to the resin was mixed. It was then stirred with a rotation/revolution mixer ("AR-250", manufactured by Thinky) and degassed for 60 seconds each, to obtain a mixture of resin and zinc oxide, and this mixture was filled into an LED lead frame (refer to FIG. 13) to a thickness of 50 μm. Thereafter, in order to sediment zinc oxide, the mixture was placed sequentially in an oven at 80° C. for 10 minutes, in an oven at 120° C. for 10 minutes and in an oven at 150° C. for 60 minutes, respectively, to cure the silicon resin slowly and form a first layer (sulfuric gas absorption layer) over a reflective plate (silver-plated copper alloy).

Next, in a resin (silicon resin, "OE-6630", manufactured by Toray Dow Corning (Solution A:Solution B=1:4)), phosphor (composition: SrGa$_2$S$_4$:Eu) of 5 wt. % with respect to the resin was mixed. It was then stirred with a rotation/revolution mixer ("AR-250", manufactured by Thinky) and degassed for 60 seconds each, to obtain a mixture of resin and phosphor. This mixture was filled into an LED lead frame (refer to FIG. 13) to a thickness of 700 μm above the first layer (sulfuric gas absorption layer). Thereafter, the mixture was placed sequentially in an oven at 80° C. for 5 minutes, in an oven at 120° C. for 5 minutes and in an oven at 150° C. for 60 minutes, respectively, to cure the silicon resin and form a second layer (phosphor-containing layer) over the first layer (sulfuric gas absorption layer), producing an LED package (sample) as shown in FIG. 18.

Example 2-2 to Example 2-18

LED package (samples) were produced similarly to (Example 2-1) except that the concentration of zinc oxide in the first layer (sulfuric gas absorption layer) and the thickness of the first layer (sulfuric gas absorption layer) were changed as shown in Table 3 (refer to FIG. 18).

Comparative Example 2-1

An LED package (sample) was produced similarly to (Example 2-1) except that the concentration of zinc oxide with respect to the resin in the first layer was 0 wt. %, that is to say, no zinc oxide was mixed, as shown in Table 3 (refer to FIG. 19).

TABLE 3

| | 1st layer (sulfuric gas absorption layer) | | 2nd layer (phosphor-containing layer) | | Light-emission maintenance rate after 1,000 hours (%) |
|---|---|---|---|---|---|
| | Zinc oxide concentration (wt. %) | Thickness of sulfuric gas absorption layer | Phosphor concentration (wt. %) | Thickness of phosphor-containing layer | |
| Example 2-1 | 0.1 | 50 um | 5 | 700 um | 75 |
| Example 2-2 | 1 | | 5 | | 80 |
| Example 2-3 | 5 | | 5 | | 88 |
| Example 2-4 | 10 | | 5 | | 91 |
| Example 2-5 | 20 | | 5 | | 97 |
| Example 2-6 | 40 | | 5 | | 98 |
| Example 2-7 | 0.1 | 80 um | 5 | 700 um | 90 |
| Example 2-8 | 1 | | 5 | | 95 |
| Example 2-9 | 5 | | 5 | | 100 |
| Example 2-10 | 10 | | 5 | | 98 |
| Example 2-11 | 20 | | 5 | | 98 |
| Example 2-12 | 40 | | 5 | | 98 |
| Example 2-13 | 0.01 | 160 um | 5 | 700 um | 92 |
| Example 2-14 | 0.1 | | 5 | | 98 |
| Example 2-15 | 1 | | 5 | | 100 |

TABLE 3-continued

|  | 1st layer (sulfuric gas absorption layer) | | 2nd layer (phosphor-containing layer) | | Light-emission maintenance rate after 1,000 hours (%) |
| --- | --- | --- | --- | --- | --- |
|  | Zinc oxide concentration (wt. %) | Thickness of sulfuric gas absorption layer | Phosphor concentration (wt. %) | Thickness of phosphor-containing layer | |
| Example 2-16 | 5 | | 5 | | 98 |
| Example 2-17 | 10 | | 5 | | 99 |
| Example 2-18 | 20 | | 5 | | 100 |
| Comparative Example 2-1 | 0 | 50 um | 5 | 700 um | 48 |

(Results)

When the LED packages (samples) produced in the above examples and comparative example were stored in a mini environmental tester at 85° C. temperature and 85% RH humidity for 1,000 hours and then removed, the results of Table 2 and Table 3 were obtained.

While no alteration was observed in the color, or the like, of the reflective plate with Examples (1-1) to (1-7) and Examples (2-1) to (2-18), the reflective plate was observed to be blackened with Comparative Example (1-1) and Comparative Example (2-1). This is believed to be caused by the sulfur-containing gas generated from the sulfur-containing phosphor, in particular hydrogen sulfide, reacting with the reflective plate (silver-plated copper alloy), for instance causing the silver to turn into silver sulfide and blacken. When the reflective plate blackens in this way, light-emission of the LED package (sample) is decreased. In addition, if the blackened metal member is an electrode other than the reflective plate, wiring disconnection and higher resistance are also triggered.

It was found that, when an LED package is produced in such a way that a sulfuric gas-adsorbing substance (zinc oxide in the present example) is present at high concentrations near the metal member (reflective plate) as in Examples (1-1) to (1-7), since the sulfuric gas that was generated, in particular hydrogen sulfide, caused by the sulfur-containing phosphor, is preferentially adsorbed by the sulfuric gas-adsorbing substance (zinc oxide in the present example) rather than reacting with the metal member (reflective plate), corrosion of the metal member can be suppressed, allowing an equivalent light-emission to before the environmental test to be maintained.

In addition, it was found that, also when a sulfuric gas absorption layer containing a sulfuric gas-adsorbing substance (zinc oxide in the present example) was provided between the metal member (reflective plate) and the phosphor-containing layer as in Examples (2-1) to (2-18), similarly to above, since the sulfuric gas that was generated, in particular hydrogen sulfide, caused by the sulfur-containing phosphor, is preferentially adsorbed by the sulfuric gas-adsorbing substance (zinc oxide in the present example) rather than reacting with the metal member (reflective plate), corrosion of the metal member can be suppressed, allowing an equivalent light-emission to before the environmental test to be maintained.

Conversely, when a resin layer that does not contain a sulfuric gas-adsorbing substance is provided between the metal member and the phosphor-containing layer as in Comparative Example (2-1), even if the phosphor-containing layer containing a sulfur-containing phosphor and the metal member are not directly in contact, inability to suppress the corrosion by sulfuric gas was observed. Also from this point, the sulfuric gas-adsorbing substance was confirmed to suppress corrosion of the metal member.

Examples 3-1 to 3-10

LED package (samples) were produced similarly to (Example 1-3) except that, the mixing ratio of two species of zinc oxide with different specific surface areas was varied to prepare a zinc oxide mix powder having a prescribed average specific surface area (refer to Table 4), and this zinc oxide mix powder was used as the sulfuric gas-adsorbing substance in Example 1-3.

The obtained samples were measured for their light-emission maintenance rates (%) after 3,000 hours and the results are shown in Table 4; at the same time, the relationship between the specific surface area and the light-emission maintenance rate (%) after 3,000 hours are shown as a graph in FIG. 20.

TABLE 4

|  | Zinc oxide 1 Concentration (wt. %) | Zinc oxide 2 Concentration (wt. %) | Zinc oxide 3 Concentration (wt. %) | Zinc oxide 4 Concentration (wt. %) | Zinc oxide 5 Concentration (wt. %) | Mixed powder specific surface area ($m^2/g^{-1}$) | Light-emission maintenance rate after 3,000 hours (%) |
| --- | --- | --- | --- | --- | --- | --- | --- |
| Example 3-1 | — | 10 | — | — | — | 2.13 | 22 |
| Example 3-2 | 5 | 5 | — | — | — | 20.13 | 53 |
| Example 3-3 | 7.5 | 2.5 | — | — | — | 28.53 | 64 |
| Example 3-4 | 9 | 1 | — | — | — | 36.94 | 59 |
| Example 3-5 | — | — | 10 | — | — | 0.70 | 20 |
| Example 3-6 | 5 | — | 5 | — | — | 15.96 | 40 |
| Example 3-7 | 7.5 | — | 2.5 | — | — | 25.22 | 60 |
| Example 3-8 | 9 | — | 1 | — | — | 34.48 | 60 |

TABLE 4-continued

| | Zinc oxide 1 Concentration (wt. %) | Zinc oxide 2 Concentration (wt. %) | Zinc oxide 3 Concentration (wt. %) | Zinc oxide 4 Concentration (wt. %) | Zinc oxide 5 Concentration (wt. %) | Mixed powder specific surface area (m$^2$/g$^{-1}$) | Light-emission maintenance rate after 3,000 hours (%) |
|---|---|---|---|---|---|---|---|
| Example 3-9 | — | — | — | 10 | — | 0.57 | 20 |
| Example 3-10 | — | — | — | — | 10 | 0.25 | 20 |
| Example 1-3 | 10 | — | — | — | — | 38.47 | 50 |
| Comparative Example 1-1 | — | — | — | — | — | — | 15 |

From the results of Table 4 and FIG. 20, regarding the ZnO-based compound used as sulfuric gas-adsorbing substance, it was found that light-emission intensity could be maintained all the more in the case of ZnO-based compounds with specific surface areas of 18 m$^2$/g or greater, and among them, 18 m$^2$/g or greater or, 40 m$^2$/g or less.

Examples 4-1 to 4-5 and Comparative Examples 4-1 to 4-2

LED packages (samples) were produced similarly to (Example 1-3) except that, in Example 1-3, substances other than ZnO-based compounds were used as the sulfuric gas-adsorbing substance, as shown in Table 5 below.

The obtained samples were measured for the light-emission maintenance rate (%) after 200 hours and the results are shown in Table 4

TABLE 5

| | Sulfide phosphor | | Sulfuric gas-adsorbing substance | | Light-emission maintenance rate after 200 hours (%) |
|---|---|---|---|---|---|
| | Composition | Concentration (wt %) | Composition | Concentration (wt %) | |
| Example 1-3 | SrGaS:Eu | 5 | ZnO | 10 | 96 |
| Example 4-1 | | 5 | La$_2$O$_3$ | 10 | 61 |
| Example 4-2 | | 5 | SrO | 10 | 60 |
| Example 4-3 | | 5 | Zeolite: Ferrierite type SiO$_2$/Al$_2$O$_3$ | 10 | 64 |
| Example 4-4 | | 5 | CaO | 10 | 69 |
| Example 4-5 | | 5 | ZnAl$_2$O$_4$ | 10 | 60 |
| Comparative Example 1-1 | | 5 | none | 0 | 55 |
| Comparative Example 4-1 | | 5 | SiO$_2$ | 10 | 55 |
| Comparative Example 4-2 | | 5 | Al$_2$O$_3$ | 10 | 48 |

From the results of Table 5, it was found that the light-emission intensity could be maintained also by using, aside from ZnO-based compounds, alkaline-earth oxides such as MgO-based compounds, CaO-based compounds, BaO-based compounds and SrO-based compounds, and rare earth oxides and zeolites such as La$_2$O$_3$-based compounds, as the sulfuric gas-adsorbing substance.

Note that ZnAl$_2$O$_4$ used in Example 4-5 is a ZnO-based compound that contains ZnO as the main component phase and ZnAl$_2$O$_4$ as the impurity phase; it was found that if a ZnO-based compound contains Zn and O, it reacts with sulfuric gas, and, light from an LED, or the like, is not absorbed and the color is not affected.

Examples 5-1 to 5-8 and Comparative Examples 5-1 to 5-5

LED packages (samples) were produced similarly to (Example 2-17) except that, in Example 2-17 a phosphor other than SrGa$_2$S$_4$:Eu was used as the phosphor, as shown in Table 6.

The "Coated CaGa$_2$S$_4$:Eu" used in Example 5-4 was prepared as follows.

The starting raw materials CaS, Ga$_2$S$_3$ and EuS were weighed and mixed so as to yield the target composition, and mixed for 100 minutes with a paint shaker using a ø 3 mm zirconia ball as media. The obtained mixture was fired in a hydrogen sulfide atmosphere at 980° C. for 4 hours. Next, the material obtained by firing was crushed for one minute with an automatic mortar grinder ("ALM-360T" manufactured by Nitto Kagaku Co.), and using sieves with 140 mesh and 440 mesh openings, the material under the sieve with 140 mesh opening and above the sieve with 440 mesh opening was recovered to obtain a CaGa$_2$S$_4$:Eu$^{2+}$ phosphor powder.

Pure water, Si(OEt)$_4$, and H$_3$BO$_3$ were added to ethanol in which the obtained CaGa$_2$S$_4$:Eu$^{2+}$ phosphor powder had been suspended, a small amount of ammonia water was further added as catalyst, and hydrolysis at 60° C. was carried out to synthesize a glass precursor/phosphor complex in which a precursor gel of glass is coated on the phosphor surface.

This complex was heat-treated at 600° C. for 30 minutes to obtain a "B$_2$O$_3$—SiO$_2$ glass-coated CaGa$_2$S$_4$:Eu$^{2+}$ phosphor", which is coated with B$_2$O$_3$—SiO$_2$ glass.

Next, 10 parts in mass of ZnO (30 nm average particle size) with respect to 100 parts in mass of the phosphor was introduced into an eggplant-shaped flask along with 50 mL ethanol, and ZnO was dispersed in ethanol with an ultrasonic cleaning device. 10 g of the "$B_2O_3$—$SiO_2$ glass-coated $CaGa_2S_4$:$Eu^{2+}$ phosphor" obtained earlier was added thereto, and ethanol was evaporated while stirring with an evaporator to obtain a ZnO-coated $B_2O_3$—$SiO_2$ glass-coated $CaGa_2S_4$:$Eu^{2+}$ phosphor (sample).

The "coated SrS:Eu" used in Example 5-5 was prepared as follows.

The starting raw materials SrS and EuS were weighed and mixed so as to yield the target composition, and mixed for 100 minutes with a paint shaker using a ø 3 mm zirconia ball as media. The obtained mixture was fired in a hydrogen sulfide atmosphere at 1,100° C. for 6 hours. Next, the material obtained by firing was crushed for one minute with an automatic mortar grinder ("ALM-360T" manufactured by Nitto Kagaku Co.), and using sieves with 140 mesh and 440 mesh openings, the material under the sieve with 140 mesh opening and above the sieve with 440 mesh opening was recovered to obtain an SrS:$Eu^{2+}$ phosphor powder.

Pure water, Si(OEt)$_4$, and $H_3BO_3$ were added to ethanol in which the obtained SrS:$Eu^{2+}$ phosphor had been suspended, a small amount of ammonia water was further added as catalyst, and hydrolysis at 60° C. was carried out to synthesize a glass precursor/phosphor complex in which a precursor gel of glass is coated on the phosphor surface.

This complex was heat-treated at 600° C. for 30 minutes to obtain a "$B_2O_3$—$SiO_2$ glass-coated SrS:$Eu^{2+}$ phosphor, which is coated with $B_2O_3$—$SiO_2$ glass".

Into an eggplant-shaped flask, 10 parts in mass of ZnO (30 nm average particle size) with respect to 100 parts in mass of the phosphor was introduced along with 50 mL ethanol, and ZnO was dispersed in ethanol with an ultrasonic cleaning device. 10 g of the "$B_2O_3$—$SiO_2$ glass-coated SrS:$Eu^{2+}$ phosphor" mentioned earlier was added thereto, and ethanol was evaporated while stirring with an evaporator to obtain a ZnO and $B_2O_3$—$SiO_2$ glass-coated SrS:$Eu^{2+}$ phosphor (sample).

The "coated CaS:Eu product" used in Example 5-6 was prepared as follows.

The starting raw materials CaS and EuS were weighed and mixed so as to yield the target composition, and mixed for 100 minutes with a paint shaker using a ø 3 mm zirconia ball as media. The obtained mixture was fired in a hydrogen sulfide atmosphere at 1,100° C. for 6 hours. Next, the material obtained by firing was crushed for one minute with an automatic mortar grinder ("ALM-360T" manufactured by Nitto Kagaku Co.), and using sieves with 140 mesh and 440 mesh openings, the material under the sieve with 140 mesh opening and above the sieve 440 mesh opening was recovered to obtain a CaS:$Eu^{2+}$ phosphor powder. Pure water and Si(OEt)$_4$ were added to ethanol in which the obtained CaS:$Eu^{2+}$ phosphor powder had been suspended, a small amount of ammonia water was further added as catalyst, and hydrolysis at 60° C. was carried out to obtain a "$SiO_2$ glass-coated CaS:$Eu^{2+}$ phosphor", which was coated with $SiO_2$ glass.

Into an eggplant-shaped flask, 2 parts in mass of ZnO (30 nm average particle size) with respect to 100 parts in mass of the phosphor was introduced along with 50 mL ethanol, and ZnO was dispersed in ethanol with an ultrasonic cleaning device. 10 g of the "$SiO_2$ glass-coated CaS:$Eu^{2+}$ phosphor" obtained earlier was added thereto, and ethanol was evaporated while stirring with an evaporator to obtain a ZnO— and $SiO_2$ glass-coated CaS:$Eu^{2+}$ phosphor (sample).

As the phosphors used in Examples 5-7 and 5-8 and Comparative Examples 5-4 and 5-5 were phosphors that did not contain sulfur (S), they were stored in a chamber at 30° C. temperature, 92% humidity and 3 ppm hydrogen sulfide concentration, and the light-emission intensities before and after the storage were compared.

The obtained samples were measured for their light-emission maintenance rates (%) after 1,000 hours, and the results are shown in Table 6.

TABLE 6

| | 1st layer (sulfuric gas absorption layer) | | 2nd layer (phosphor-containing layer) | | | Light-emission |
|---|---|---|---|---|---|---|
| | Zinc oxide concentration (wt %) | Thickness of sulfuric gas absorption layer | Phosphor | Phosphor concentration (wt %) | Thickness of phosphor-containing layer | maintenance rate after 1,000 hours (%) |
| Example 2-17 | 10 | 160 um | $SrGa_2S_4$: Eu | 5 | 700 um | 99 |
| Example 5-1 | 10 | | $CaGa_2S_4$: Eu | 5 | | 96 |
| Example 5-2 | 10 | | SrS: Eu | 5 | | 54 |
| Example 5-3 | 10 | | CaS: Eu | 5 | | 60 |
| Example 5-4 | 10 | | Coated $CaGa_2S_4$: Eu | 5 | | 99 |
| Example 5-5 | 10 | | Coated SrS: Eu | 5 | | 99 |
| Example 5-6 | 10 | | Coated CaS: Eu t | 5 | | 99 |
| Comparative Example 5-1 | 0 | None | $CaGa_2S_4$: Eu | 5 | | 69 |
| Comparative Example 5-2 | 0 | None | SrS: Eu | 5 | | 23 |
| Comparative Example 5-3 | 0 | None | CaS: Eu | 5 | | 30 |
| Example 5-7 | 10 | 160 um | $Y_3Al_5O_{12}$: Ce | 5 | 700 um | 100 |
| Example 5-8 | 10 | | $Sr_2SiO_4$: Eu | 5 | | 100 |
| Comparative Example 5-4 | 0 | None | $Y_3Al_5O_{12}$: Ce | 5 | | 76 |
| Comparative Example 5-5 | 0 | None | $Sr_2SiO_4$: Eu | 5 | | 73 |

From the results of Table 6, it was verified that even if the sulfur-containing phosphor was other than $SrGa_2S_4$:Eu, the deterioration due to hydrogen sulfide gas generated therefrom could be prevented and the light-emission intensity maintained.

In addition, as shown in Comparative Examples 5-4 and 5-5, it was verified that, even if the phosphor did not contain sulfur, there was deterioration due to hydrogen sulfide gas and the light-emission intensity decreased, and at the same time, even in such a circumstance, deterioration due to hydrogen sulfide gas could be prevented with the sulfuric gas-adsorbing substance and the light-emission intensity maintained.

[Explanation of the Denotations]
1 Solid light-emitting element
2 Metal member reacting with sulfuric gas
3 Phosphor
4 Sulfuric gas-adsorbing substance
5 Phosphor-containing layer
6 Resin
7 Phosphor-containing layer
8 Sulfuric gas absorption layer

The invention claimed is:

1. A light emitting device comprising a solid light emitting element, a metal member reacting with sulfuric gas, and a phosphor-containing layer,
wherein the phosphor-containing layer contains a sulfide phosphor and a sulfuric gas absorbing substance absorbing the sulfuric gas, and when the phosphor-containing layer is tripartitioned from the side near the metal member to far into a proximal layer portion, an intermediate layer portion and an outer layer portion, the concentration of sulfuric gas-adsorbing substance in the proximal layer portion is higher than those in the intermediate layer portion and the outer layer portion.

2. The light emitting device according to claim 1, wherein the sulfuric gas-adsorbing substance is a substance that can chemically adsorb sulfuric gas and moreover maintains transparency even if sulfurized.

3. The light emitting device according to claim 1, wherein in the sulfuric gas absorbing substance, a value of L* after reaction with the sulfuric gas is not less than 60.

4. The light emitting device according to claim 1, wherein the sulfuric gas-adsorbing substance is one species, two species or more selected from the group comprising ZnO-based compound, MgO-based compound, CaO-based compound, BaO-based compound, SrO-based compound and rare earth oxide.

5. The light emitting device according to claim 4, wherein the sulfuric gas absorbing substance contains the ZnO-based compound which specific surface area is not less than $18\,m^2/g$ and not more than $40\,m^2/g$.

6. The light emitting device according to claim 1, wherein the sulfuric gas-adsorbing substance is a substance that can physically adsorb sulfuric gas and moreover maintains transparency even if sulfurized.

7. The light emitting device according to claim 6, wherein the sulfuric gas-adsorbing substance in the sulfuric gas adsorption layer is a zeolite, a molecular sieve or both.

8. The light emitting device according to claim 1, wherein the phosphor-containing layer is provided with a constitution of a sulfide phosphor dispersed within a resin.

9. The light emitting device according to claim 8, wherein the resin is a silicone resin, an epoxy resin, an acrylic resin, an imide resin, or a urethane resin.

10. The light emitting device according to claim 1, wherein the phosphor-containing layer and the sulfuric gas absorbing layer are formed through a heating process.

11. An illumination apparatus equipped with the light-emitting device according to claim 1.

12. An optical apparatus equipped with the light-emitting device according to claim 1.

13. A light emitting device comprising a solid light emitting element, a metal member reacting with sulfuric gas, and a phosphor-containing layer containing a sulfide phosphor and further comprising, between the metal member and the phosphor-containing layer, a sulfuric gas absorbing layer containing a sulfuric gas adsorbing substance adsorbing the sulfuric gas,
wherein the sulfuric gas absorbing layer comprises a resin and the sulfuric gas adsorbing substance, the resin is a silicone resin, an epoxy resin, an acrylic resin, an imide resin, or a urethane resin, and
the phosphor-containing layer is provided with a constitution of a sulfide phosphor dispersed within a resin, and the resin in the phosphor-containing layer and the resin in the sulfuric gas absorbing layer are the same resin.

14. A light emitting device comprising a configuration in which a sulfuric gas absorbing layer comprising a sulfuric gas adsorbing substance adsorbing the sulfuric gas and the resin covers a solid light emitting element and a metal member reacting with sulfuric gas, and the outside is covered by a phosphor-containing layer containing a sulfide phosphor and the resin,
wherein the sulfuric gas absorbing layer comprises a resin and the sulfuric gas adsorbing substance, the resin is a silicone resin, an epoxy resin, an acrylic resin, an imide resin, or a urethane resin, and
the phosphor-containing layer is provided with a constitution of a sulfide phosphor dispersed within a resin, and the resin in the phosphor-containing layer and the resin in the sulfuric gas absorbing layer are the same resin.

15. The light emitting device according to claim 13, wherein the sulfuric gas-adsorbing substance is a substance that can chemically adsorb sulfuric gas and moreover maintains transparency even if sulfurized.

16. The light emitting device according to claim 14, wherein the sulfuric gas-adsorbing substance is a substance that can chemically adsorb sulfuric gas and moreover maintains transparency even if sulfurized.

17. The light emitting device according to claim 13, wherein in the sulfuric gas absorbing substance, a value of L* after reaction with the sulfuric gas is not less than 60.

18. The light emitting device according to claim 14, wherein in the sulfuric gas absorbing substance, a value of L* after reaction with the sulfuric gas is not less than 60.

19. The light emitting device according to claim 13, wherein the sulfuric gas-adsorbing substance is one species, two species or more selected from the group comprising ZnO-based compound, MgO-based compound, CaO-based compound, BaO-based compound, SrO-based compound and rare earth oxide.

20. The light emitting device according to claim 14, wherein the sulfuric gas-adsorbing substance is one species, two species or more selected from the group comprising ZnO-based compound, MgO-based compound, CaO-based compound, BaO-based compound, SrO-based compound and rare earth oxide.

21. The light emitting device according to claim 19 or 20, wherein the sulfuric gas absorbing substance contains the ZnO-based compound which specific surface area is not less than $18\,m^2/g$ and not more than $40\,m2/g$.

22. The light emitting device according to claim 13, wherein the sulfuric gas-adsorbing substance is a substance that can physically adsorb sulfuric gas and moreover maintains transparency even if sulfurized.

23. The light emitting device according to claim 14, wherein the sulfuric gas-adsorbing substance is a substance that can physically adsorb sulfuric gas and moreover maintains transparency even if sulfurized.

24. The light emitting device according to claim 22 or 23, wherein the sulfuric gas-adsorbing substance in the sulfuric gas adsorption layer is a zeolite, a molecular sieve or both.

25. The light emitting device according to claim 13, wherein the phosphor-containing layer and the sulfuric gas absorbing layer are formed through a heating process.

26. The light emitting device according to claim 14, wherein the phosphor-containing layer and the sulfuric gas absorbing layer are formed through a heating process.

27. An illumination apparatus equipped with the light-emitting device according to claim 13.

28. An optical apparatus equipped with the light-emitting device according to claim 13.

29. An illumination apparatus equipped with the light-emitting device according to claim 14.

30. An optical apparatus equipped with the light-emitting device according to claim 14.

* * * * *

UNITED STATES PATENT AND TRADEMARK OFFICE
CERTIFICATE OF CORRECTION

PATENT NO. : 9,166,119 B2
APPLICATION NO. : 14/009650
DATED : October 20, 2015
INVENTOR(S) : Haruka Shimizu et al.

It is certified that error appears in the above-identified patent and that said Letters Patent is hereby corrected as shown below:

IN THE CLAIMS
Column 20, Line 56, Claim 21, delete "m2/g." and insert -- $m^2/g$. --

Signed and Sealed this
Twenty-second Day of March, 2016

Michelle K. Lee
*Director of the United States Patent and Trademark Office*